United States Patent [19]
Jiang et al.

[11] Patent Number: 5,812,482
[45] Date of Patent: Sep. 22, 1998

[54] WORDLINE WAKEUP CIRCUIT FOR USE IN A PULSED WORDLINE DESIGN

[75] Inventors: Yong H. Jiang, Milipitas; Steve Lim, Cupertino, both of Calif.

[73] Assignee: Integrated Silicon Solution Inc., Santa Clara, Calif.

[21] Appl. No.: 748,861

[22] Filed: Nov. 13, 1996

[51] Int. Cl.$^6$ .................................................. G11C 8/00
[52] U.S. Cl. ................. 365/230.06; 365/233; 365/194
[58] Field of Search ............................ 365/230.06, 233, 365/194, 227

[56] References Cited

U.S. PATENT DOCUMENTS

| | | | |
|---|---|---|---|
| 5,598,375 | 1/1997 | Yang et al. | 365/230.06 |
| 5,598,376 | 1/1997 | Merritt et al. | 365/233 X |
| 5,602,795 | 2/1997 | Sandhu | 365/230.06 |
| 5,636,165 | 6/1997 | Amatangelo et al. | 365/194 |

*Primary Examiner*—Huan Hoang
*Attorney, Agent, or Firm*—Douglas J. Crisman; Flehr Hohbach Test Albritton & Herbert LLP

[57] ABSTRACT

A wordline wakeup circuit for use in a static memory responsive to an external clock signal and chip enable signals provided by a controller/microprocessor to perform a memory operation on the static memory. The wordline wakeup circuit receives a global clock (GCLK) signal generated by memory control circuitry from the external clock signal and a word line enable (WLEN) signal asserted by the control circuitry when the chip enables indicate a pending memory operation. The wordline wakeup circuit asserts a wordline wakeup signal (LWLEN) signal as soon as possible after the GCLK signal goes high. The LWLEN signal when asserted activates decoder circuity to assert wordlines as necessary to perform the memory operation. If the WLEN signal is provided, the wordline wakeup circuit keeps the LWLEN signal high for at least the high portion of the GCLK signal, enabling the decoder to execute the memory operation, if the WLEN signal is not provided, the wordline wakeup circuit drops the LWLEN signal. The short pulse made by the LWLEN signal when there is no pending memory operation does not affect the decoder.

11 Claims, 3 Drawing Sheets

5,812,482

WORDLINE WAKEUP CIRCUIT FOR USE IN A PULSED WORDLINE DESIGN

The present invention relates generally to semiconductor memories and, particularly, to circuits for activating memory circuitry previously placed in a power saving mode wherein normal memory operations cannot be performed.

BACKGROUND OF THE INVENTION

There is a long-recognized need for technical innovations that reduce power consumption in electronic devices. In particular, there have been myriad efforts to reduce power consumption in computers and other devices that use integrated circuits such as microprocessors and semiconductor memories.

One common strategy is to disable (or put to sleep) at least partially circuits that are not in use and then to activate (or wake up) the disabled circuits as they are needed.

This strategy can be implemented in a consistent manner within a particular device so that a circuit that is asleep is provided with a wakeup signal by another device some predefined time before an operation is required. For example, a microprocessor designed to operate with a memory including memory control circuitry that can be put to sleep when no memory operation is pending might send the control circuitry a wakeup signal prior to performing a memory operation. However, it is quite common that microprocessors and memories with disparate capabilities are combined in a single electronic device in which there is no coordination of power-down and wakeup operations.

For example, a memory that includes control circuitry that goes to sleep when there is no pending memory operation might be combined with a microprocessor that is not aware of those capabilities. In such a system the microprocessor would initiate a memory operation (e.g., by issuing a chip enable signal, such as a write or output enable) without first issuing a wakeup signal to the control circuitry. As a result, upon receiving the chip enable signal the control circuitry may not have adequate time to wakeup and perform the specified memory operation on the array. A conventional memory system with a power down mode might compensate for this problem by lengthening memory access times to allow the control circuitry time to wake up and perform the requested memory operation whenever a chip enable signal is received. Of course, this solution would slow both the memory and the microprocessor.

SUMMARY OF THE INVENTION

The present invention is a circuit implementable within a static memory that can issue a wakeup signal to disabled portions of the memory control circuitry prior to the initiation of a memory operation by a microprocessor or a master device that is not configured to provide the wakeup signal itself. The present invention accomplishes this by asserting the wakeup signal following every active transition of a global clock signal that might be followed by signals (such as write or output enables) from the microprocessor/master initiating the memory operation. If a clock signal active transition is not followed by the expected memory operation signals, the present invention deactivates the wakeup signal, which has the effect of placing the affected portions of the memory circuitry back in a power saving mode. If an active transition is followed by the expected signals, the present invention maintains the wakeup signal in its active state for at least the high portion of one period of the global clock, which enables the affected portions of the memory circuitry to perform the desired memory operation. So that the disabled portions of the circuitry are enabled and can perform some pre-operation activity before the expected signals are issued by the microprocessor/master, the present invention asserts the wakeup signal as soon as possible after an active transition of the global clock signal.

In particular, the present invention is a wordline wakeup circuit that provides a wordline wakeup signal for use in a static memory array wherein memory cells are arranged in rows, each with an associated wordline. The static memory array includes wordline control circuitry that activates a particular wordline in response to address signals provided by an external device (e.g., a microprocessor) performing a memory operation. A memory operation can only be performed on a row whose associated wordline is activated. When the wordline wakeup signal is unasserted the wordline circuitry is disabled and cannot activate the wordlines.

The wordline wakeup circuit has inputs coupled to a global clock signal (GCLK) and a word line enable (WLEN) signal. The WLEN signal is asserted by the static memory in response to control signals issued by an external device to indicate an active memory cycle wherein a memory operation is to be performed on the row identified by the address signals. The WLEN signal makes an active transition following an active transition of the GCLK signal and remains asserted for approximately one period of the GCLK signal.

A preferred embodiment of the wordline wakeup circuit includes a delay circuit and a qualification circuit. The delay circuit outputs a delay clock signal (DCLK) that is a delayed version of the GCLK signal. The qualification circuit asserts the wordline wakeup signal in response to predefined combinations of the DCLK, global clock and a wordline enable (WLEN) signal. The delay circuit introduces a first delay between active transitions of the GCLK and DCLK signals that is longer than a second delay between active transitions of the GCLK and WLEN signals.

Consequently, before each active cycle the wordline wakeup signal makes an active transition immediately after the active transition of the GCLK signal. Also, during the active cycle the wordline wakeup signal remains asserted for at least as long as the GCLK signal is asserted. Thus, the wordline wakeup circuit activates the wordline circuitry as soon as possible before a potential active cycle so as to be able to rapidly perform any memory operation that might be required.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 1:
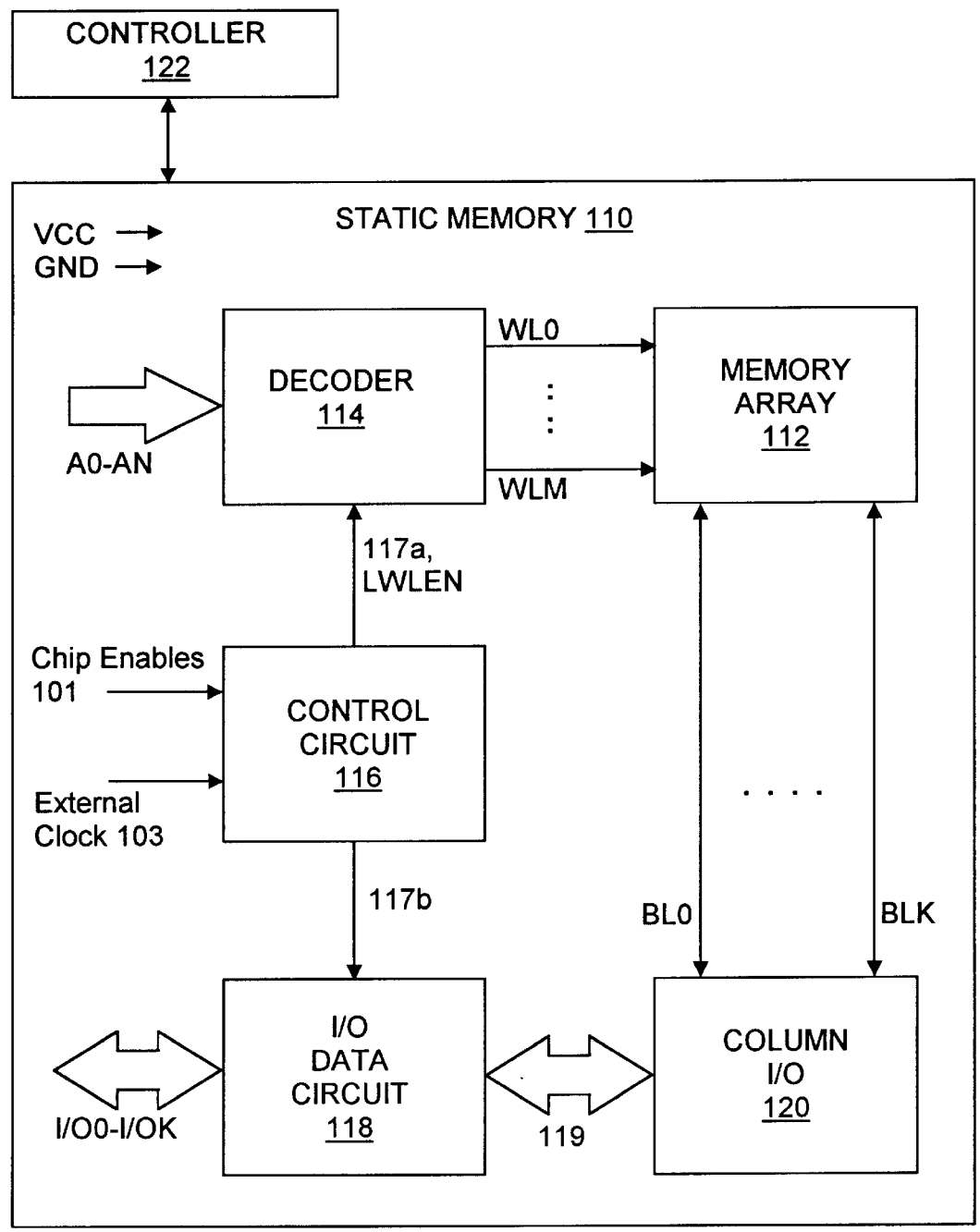
FIG. 1 is a block diagram of a static memory in which the preferred embodiment is implemented.

Referring to FIG. 1, there is shown a block diagram of a static random access memory (RAM) 110 in which the preferred embodiment can be implemented.

The static memory 110 includes a memory array 112, an address decoder 114, a control circuit 116, an input/output (I/O) data circuit 118 and column I/O circuitry 120. The memory 110 operates in response to external signals provided by a controlling device 122, such as a microprocessor.

The principle of operation of static memories, such as the memory 110, is well known and therefore is only briefly described herein. The controller 122 initiates a memory operation by asserting a chip enable signal 101 and supplying address signals AO-AN (corresponding to $2^{N+1}$ memory locations) designating the address of a memory location where the operation is to be performed. If the memory operation is a write operation, the controller 122 supplies the data to be written to the addressed memory location via the bidirectional input/output lines I/OO-I/OK (corresponding to K+1 bit memory words). If the memory operation is a read operation, the stored information from the addressed location is read out from the same bi-directional input/output lines I/OO-I/OK.

In the preferred embodiment the memory 110 is a pulsed wordline memory design wherein the timing of the memory operations is controlled by an external clock 103. The memory 110 also provides connections for external power supply (VCC) and ground (GND) signals.

The heart of the memory 110 is the memory array 112, which consists of static memory cells, each capable of storing one bit of data, arranged in rows and columns. In the conventional manner, all of the cells in one row are energized for a memory operation (either a read or a write) by a wordline WL uniquely associated with that row. A memory operation cannot be performed unless the wordline associated with the target row of cells is activated.

At least a subset of the cells in a row (typically all of the cells that store data for one memory word) can be accessed simultaneously for a given memory operation via the bit lines BL. When the memory operation is a read, the bit lines BL are coupled to sense amplifiers in the column I/O 120 that "sense" the data stored in the corresponding cells of the row whose wordline WL is active. When the memory operation is a write the bit lines BL carry the signals used to program the corresponding cells of the row associated with the active wordline.

The control circuitry 116 controls the other blocks of the memory 110 in response to the chip enables 101 and the external clock 103. Depending on the operation to be performed, the control circuitry issues the appropriate control signals 117a, 117b to the decoder 114 and the I/O data circuit, respectively.

Regardless of whether the memory operation is a write or a read, the decoder 114 decodes the address signals AO-AN and activates the wordline WL of the row that includes the memory word that is the target of the current memory operation.

If the operation is a write, the I/O data circuitry 118 buffers the input data signals I/OO-I/OK and outputs the buffered data to the column I/O 120 via the bi-directional data bus 119. The column I/O 120 then latches the input signals in parallel onto the corresponding bit lines BLO-BLK. The signals on the bit lines BLO-BLK are used to program the cells composing the word whose wordline was activated for the current operation by the decoder 114.

If the operation is a read, sense amplifiers in the column I/O 120 sense the signals on the respective bit lines BL, convert the sensed signals into binary (e.g., high or low) voltages that represent the programmed state of the addressed word and output the word's bit values to the I/O data circuit via the bi-directional bus 119. The output data are buffered by the I/O data circuit 118 and latched onto the bi-directional data lines I/OO-I/OK for use by the controller 122.

The operation so far described is typical of most memories. However, the control circuit 116 and decoder 114 perform additional functions uniquely associated with the preferred embodiment. These functions are now described.

At least a portion of the decoder 114 circuitry is configured to enter a power saving "sleep" mode when there is no pending memory operation (as indicated by at least a subset of the control signals 117a). For the reasons described in the background, this requires the memory 110 to include a system for waking the decoder 114 to perform memory operations.

In the preferred embodiment, the role of waking the decoder 114 is assigned to a wordline wakeup circuit 208 (FIG. 2) within the control circuitry 116 that asserts a wordline wakeup (LWLEN) signal coupled to the decoder 114. When the LWLEN signal is asserted, circuitry within the decoder 114 that was previously in the sleep mode (e.g., wordline control circuitry that decodes addresses AO-AN and charges the wordlines for a memory operation) is activated. Otherwise, when the LWLEN signal is inactive, the affected decoder circuitry remains in the sleep mode. The relationship of the wordline wakeup circuit to other blocks of the control circuitry 116 is now described in reference to FIG. 2.

Figure 2:
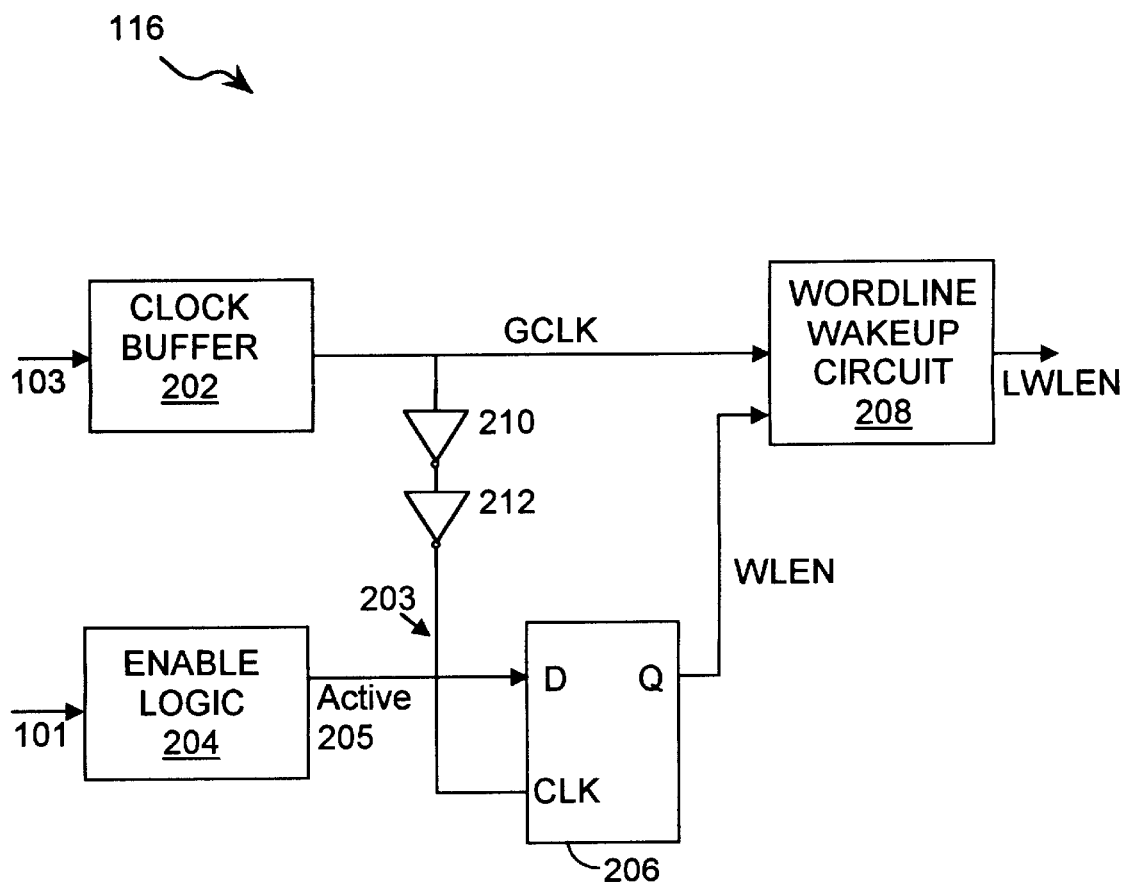
FIG. 2 is a block diagram of a subset of the static memory control circuitry that incorporates the preferred embodiment.

FIG. 2 is a block diagram showing elements of the control circuitry 116 that are involved in the generation of the LWLEN signal. A clock buffer 202 generates from the external clock 103 a global clock (GCLK) signal that is used to synchronize all operations of the memory 110. The GCLK signal is coupled directly to the wordline wakeup circuity 208 along with a wordline enable (WLEN) signal output by a DQ flip-flop 206. The flip-flop 206 generates the WLEN signal from an "Active" signal 205 in response to a clock signal 203 that is a version of the GCLK signal delayed by two gate delays provided by the inverters 210 and 212. Because of the two-gate delay, any transition of the WLEN signal occurs two gate delays after an active transition of the GCLK signal. The Active signal 205 is generated by the enable logic 204 based on the state of the chip enables 101. I.e., if any of the chip enables indicate that a memory operation is required, the enable logic 204 asserts the Active signal 205.

So that the disabled decoder 114 circuitry is available to perform any required memory operation without delay, the wordline wakeup circuitry 208 asserts the wakeup (LWLEN) signal to disabled portions of the decoder 114 prior to the initiation of any memory operation. The wordline wakeup circuitry 208 accomplishes this by asserting the LWLEN signal following every active transition of the GCLK signal. If an active transition of the GCLK signal is not followed by a WLEN signal, the wordline wakeup circuit 208 deactivates the LWLEN signal, placing the affected portions of the memory circuitry back in a power saving mode. As a result, during an inactive cycle the LWLEN signal makes a short pulse that consumes only a small amount of power. The brief LWLEN pulse is necessary to begin activating the decoder circuitry in anticipation of the possible assertion of a WLEN signal.

If an active transition of the GCLK signal is followed by a WLEN signal, the wordline wakeup circuit 208 maintains the LWLEN signal in its active state for at least the high portion of the GCLK signal, which enables the previously asleep portions of the decoder 116 to perform the desired memory operation. So that the disabled portions of the decoder 114 are enabled and can perform some pre-operation activity before the WLEN signal is issued by the enable logic 204, the wordline wakeup circuit 208 ideally asserts the LWLEN signal immediately (i.e., as soon as possible) after each active transition of the GCLK signal. Additional details of the wordline wakeup circuity 208 are now described in reference to FIGS. 3 and 4.

Figure 3:
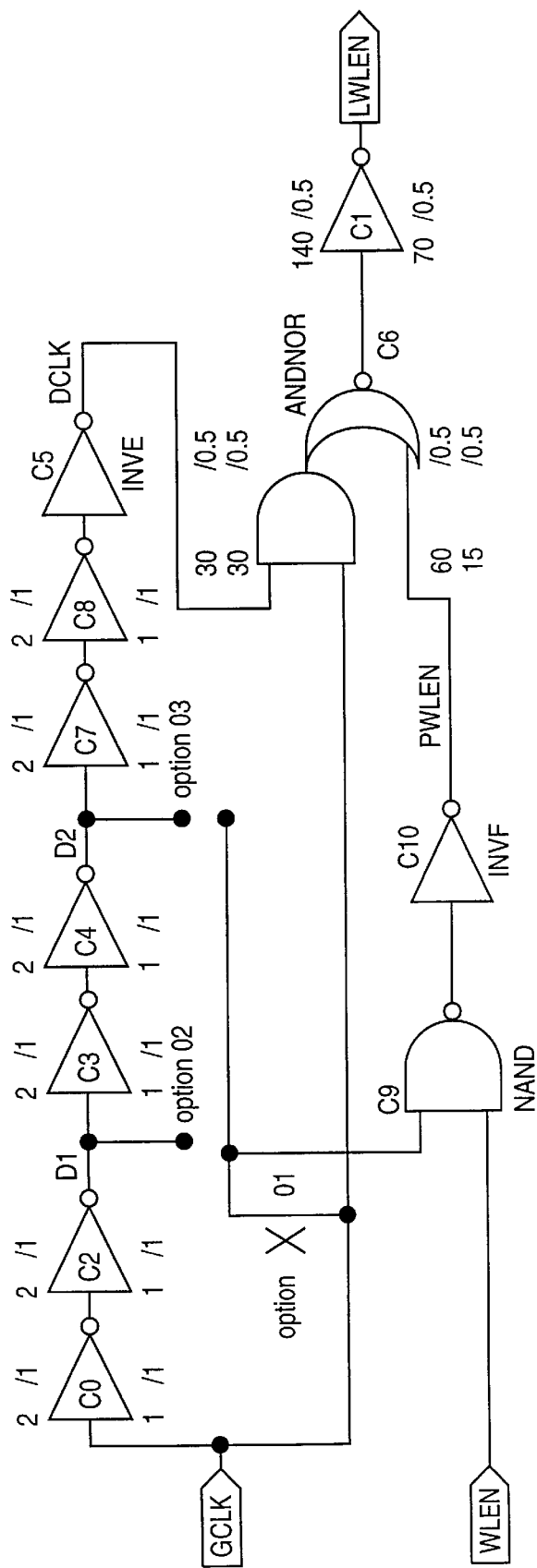
FIG. 3 is a block diagram of the preferred embodiment.
Figure 4:
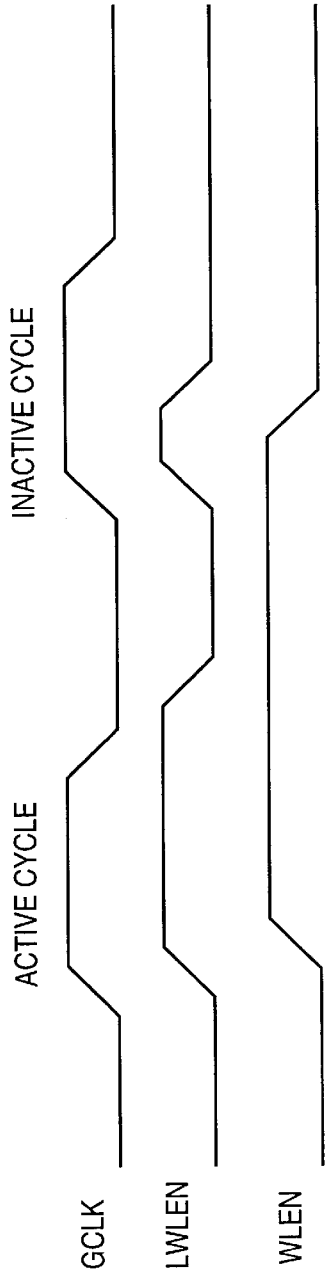
FIG. 4 is a timing diagram illustrating global clock and wordline enable signals to which the preferred embodiment is responsive and the wordline wakeup signal generated by the preferred embodiment.

FIG. 3 is a circuit diagram of a preferred embodiment of the wordline wakeup circuit 208. The operation of this circuit is illustrated by FIG. 4, which shows the timing of the GCLK, LWLEN, and WLEN signals for an active memory cycle (when there is a memory operation) and an inactive memory cycle.

Referring to FIG. 3, the preferred embodiment of the wordline wakeup circuit 208 consists of two basic blocks: a delay circuit that generates a delayed, inverted version (DCLK) of the GCLK signal and a qualification circuit that generates a LWLEN signal pulse of the appropriate length depending on whether the current GCLK cycle corresponds to an active or inactive memory cycle.

The delay circuit includes a collection of inverters C0, C2, C3, C4, C7, C8, C5 connected in series. The first buffer C0 is coupled to the GCLK signal and the last buffer C5 generates the DCLK signal.

The qualification circuit includes a two-input NAND gate C9. The first input of the NAND gate C9 is coupled to the WLEN signal; the second to either the GCLK signal or a delayed version of the GCLK signal. Which version of the GCLK signal is actually coupled to the second input of the NAND gate C9 depends on which metal option provided by the preferred embodiment is selected. The various metal options O1, O2 and O3 are indicated on FIG. 3 by the word "option". If a metal option is not implemented (in which case the connection O1 marked by the "X" is left intact and the open "option" connections O2, O3 shown in FIG. 3 remain open), the GCLK signal is coupled to the NAND gate input. If either of the illustrated metal options O2, O3 is implemented, the connection O1 is broken, one of the open "option" O2, O3 connections is closed and the corresponding delayed version of the GCLK signal is input to the NAND gate C9. The particular metal option O1, O2, O3 selected determines the length of time the LWLEN signal remains asserted during an active memory. Which option is selected is a design choice that depends on the length of time needed for the disabled decoder 114 circuitry to be activated and to execute a memory operation.

The output of the NAND gate C9 is coupled to the input of the inverter C10, whose output is in turn coupled to one input of a three input ANDNOR gate C6. The other two inputs of the ANDNOR gate C6 (i.e., the inputs tied to the AND gate contained within the ANDNOR gate) are tied to the GCLK and DCLK signals, respectively. The output of the ANDNOR gate C6 is coupled to the input of another inverter C1, which generates the wordline wakeup (LWLEN) signal. In addition to providing inverting logic, the inverter C1 provides additional drive strength for the LWLEN signal. The operation of the wordline wakeup circuit 208 is now described in reference to FIG. 4.

As shown in FIG. 4, the LWLEN signal produced by the wordline wakeup circuit 208 initially goes high shortly after the GCLK signal rises and before the WLEN signal rises. This is due to the delay between the GCLK and DCLK signals, which ensures that the GCLK and DCLK signals are both high for a short period of time before the DCLK signal drops. As long as both the DCLK and GCLK signals are high, the LWLEN signal will also remain high. This initial high phase of the LWLEN signal occurs each time the GCLK signal is asserted and begins to power up the decoder 114 in anticipation of a memory operation.

The number of inverters in the delay circuit is selected to provide a delay between active transitions of the DCLK and GCLK signals that is longer than the delay between active transitions of the GCLK and WLEN signals. As a result, when the WLEN signal is asserted, the signal PWLEN output from the inverter C10 goes high before the DCLK signal drops. Thus, during an active memory cycle, the contribution from the inverter C10 enables the LWLEN signal to remain asserted without any high-low-high glitches until shortly after the GCLK signal falls. As mentioned above, the lag between the high-to-low transition of the WLEN signal and the LWLEN signal depends on which metal option O1, O2, O3 is selected.

During an inactive memory cycle following an active cycle, the LWLEN signal still makes an active transition when the GCLK and DCLK signals are both high. However, in contrast to the active cycle, the WLEN signal does not remain asserted for the entire active portion of the GCLK signal. To prevent a high-low-high glitch in the LWLEN signal that might disrupt the decoder 114, the wordline wakeup circuit 208 is designed so the WLEN signal falls before the DCLK signal. This ensures that the LWLEN signal makes only a single pulse during an inactive memory cycle. Moreover, the delay between the DCLK and GCLK signals is selected so that the LWLEN signal pulse that occurs during the inactive memory cycles triggers little or no powerconsuming activity in the decoder 114.

Thus, the preferred embodiment generates a LWLEN signal that:

(1) activates the decoder 114 for an active memory cycle;

(2) stays high long enough to allow the awakened decoder 114 circuitry to execute the memory operation without extending the period of time needed to perform the operation measured with respect to the assertion of the chip enables 101; and (3) does not activate the decoder 114 during an inactive memory cycle.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

For example, the present invention can be used to activate sense line circuitry that powers up sense lines and amplifiers for use in a memory output operation. Moreover, the present invention can be employed in any type of memory circuitry that needs to be activated from a power-saving state to perform a requested memory operation.

What is claimed is:

1. A wordline wakeup circuit that provides a wordline wakeup signal for use in a static memory wherein memory cells are arranged in rows, each having an associated wordline, and wherein a memory operation can be performed on a row only when the associated wordline for that row is activated in response to external address signals, the wordline wakeup circuit comprising:

a delay circuit configured to output a delay clock signal (DCLK) that is a delayed version of a global clock signal (GCLK); and a qualification circuit configured to assert the wordline wakeup signal in response to predefined combinations of the DCLK, global clock and a wordline enable (WLEN) signal;

the WLEN signal making an active transition following an active transition of the GCLK signal and remaining asserted for approximately one period of the GCLK signal, the WLEN signal being asserted by the memory in response to control signals issued by an external device to indicate an active memory cycle wherein the memory operation is to be performed;

the delay circuit introducing a first delay between active transitions of the GCLK and DCLK signals that is longer than a second delay between active transitions of the GCLK and WLEN signals;

such that before each active cycle the wordline wakeup signal makes an active transition immediately after the active transition of the GCLK signal;

wherein the wordline wakeup signal, when asserted, activates the wordline circuitry to perform the memory operation.

2. The wordline wakeup circuit of claim 1, wherein the active transition of the wordline wakeup signal occurs within two gate delays of the active transition of the GCLK signal.

3. The wordline wakeup circuit of claim 1, wherein during each active cycle the wordline wakeup signal remains asserted for at least as long as the GCLK signal is asserted.

4. The wordline wakeup circuit of claim 3, wherein the wordline wakeup signal remains high for only a small portion of the active phase of the GCLK signal during an inactive memory cycle wherein the WLEN signal is not asserted, the small portion ensuring that the wordline circuitry is not awakened for the full active phase of the GCLK signal by the wakeup signal during the inactive memory cycle.

5. The wordline wakeup circuit of claim 1, wherein the predefined combinations of the DCLK, global clock and WLEN signals comprise at least one of:
   (1) the DCLK signal and the GCLK signal are both asserted; and
   (2) the WLEN signal and a first input signal are both asserted; the first input signal being selected from a second delayed version of the GCLK signal or the GCLK signal.

6. The wordline wakeup circuit of claim 5, wherein the delay circuit comprises an odd number of inverting buffers connected in series, a first one of the buffers being coupled to the GCLK signal and a last one of the buffers outputting the DCLK signal.

7. The wordline wakeup circuit of claim 6, wherein the qualification circuit comprises:
   a two-input AND circuit coupled to the WLEN and first signals configured to assert a preliminary wordline enable (PWLEN) signal when the WLEN and first signals are asserted; and
   a two-input ANDOR circuit coupled to the DCLK, GCLK and PWLEN signals configured to assert the wordline wakeup signal when at least one of the following set of conditions is true:
   (1) the DCLK and GCLK signals are both asserted; and
   (2) the PWLEN signal is asserted.

8. The wordline wakeup circuit of claim 7, further comprising a metal option that, when implemented:
   (1) couples a first input of the AND circuit to the output of a particular one of the buffers separated from the GCLK signal by an odd number of intervening buffers; and
   (2) uncouples the first input of the AND-type circuit from the GCLK signal;
   the metal option thereby selecting the first signal to be the second delayed version of the GCLK signal, a third delay between active transitions of the GCLK signal and the second delayed version equaling the sum of delays of the intervening buffers.

9. The wordline wakeup circuit of claim 8, wherein:
   the odd number of inverting buffers comprises seven buffers; and
   the metal option exists at the output of a second one of the buffers and a fourth of the buffers.

10. The wordline wakeup circuit of claim 7, wherein the two-input AND circuit comprises:
    a two-input NAND gate with inputs coupled to the first signal and the WLEN signal; and
    an inverter with an input coupled to the output of the NAND gate and an output that produces the PWLEN signal.

11. The wordline wakeup circuit of claim 7, wherein the two-input ANDOR circuit comprises:
    a two-input AND gate with inputs coupled to the DCLK signal and the GCLK signal;
    a two-input NOR gate with inputs coupled to the output of the two-input AND gate and the PWLEN signal; and
    an inverter with an input coupled to the output of the NOR gate and an output that produces the wordline wakeup signal.

* * * * *